United States Patent
Oh et al.

(10) Patent No.: US 10,532,633 B2
(45) Date of Patent: Jan. 14, 2020

(54) DEHUMIDIFIER FOR VEHICLE

(71) Applicant: HYUNDAI MOTOR COMPANY, Seoul (KR)

(72) Inventors: Man Ju Oh, Yongin-si (KR); Jae Woo Park, Ansan-si (KR); Jae Woong Kim, Hwaseong-si (KR)

(73) Assignee: Hyundai Motor Company, Seoul (KR)

( * ) Notice: Subject to any disclaimer, the term of this patent is extended or adjusted under 35 U.S.C. 154(b) by 801 days.

(21) Appl. No.: 14/667,481

(22) Filed: Mar. 24, 2015

(65) Prior Publication Data

US 2016/0137036 A1 May 19, 2016

(30) Foreign Application Priority Data

Nov. 17, 2014 (KR) ........................ 10-2014-0159920

(51) Int. Cl.
*B60H 3/02* (2006.01)
*B60H 1/00* (2006.01)
*F25B 21/04* (2006.01)
*H01L 35/30* (2006.01)
(Continued)

(52) U.S. Cl.
CPC ......... *B60H 3/024* (2013.01); *B60H 1/00785* (2013.01); *F25B 21/02* (2013.01); *F25B 21/04* (2013.01); *H01L 35/00* (2013.01); *H01L 35/30* (2013.01)

(58) Field of Classification Search
CPC ......... F25D 17/04; H01L 35/00; H01L 35/30; B60H 3/024; B60H 1/00478; B60H 1/00785; B60H 1/00814; F25B 21/02; F25B 21/04; B60S 1/023; B60S 1/54; F24F 2003/1446; F24F 3/153
See application file for complete search history.

(56) References Cited

U.S. PATENT DOCUMENTS

| 5,301,515 A | * | 4/1994 | Iritani | ................ B60H 1/00392 |
|   |   |   |   | 454/121 |
| 2009/0121524 A1 | * | 5/2009 | Abe | ........................ A47C 7/748 |
|   |   |   |   | 297/180.1 |

(Continued)

FOREIGN PATENT DOCUMENTS

| JP | H07117633 A | 5/1995 |
| JP | 2006-232164 A | 9/2006 |

(Continued)

OTHER PUBLICATIONS

Korean Office Action dated Oct. 29, 2015 issued in Korean Patent Application No. 10-2014-0159920.

*Primary Examiner* — Keith M Raymond
*Assistant Examiner* — Webeshet Mengesha
(74) *Attorney, Agent, or Firm* — Morgan, Lewis & Bockius LLP

(57) ABSTRACT

A dehumidifier for a vehicle includes a heat exchanger provided in a flow path of air and configured to have a heat transfer material flowing therein so as to cool or heat the air. A first thermoelectric element is provided at an air inlet side of the heat exchanger and is configured to cool introduced air. A first thermal conductor is configured to connect a heat-generating surface of the first thermoelectric element to the heat exchanger and radiate heat generated from the first thermoelectric element through the heat exchanger.

14 Claims, 6 Drawing Sheets

(51) Int. Cl.
 *F25B 21/02* (2006.01)
 *H01L 35/00* (2006.01)

(56) References Cited

U.S. PATENT DOCUMENTS

| | | | | |
|---|---|---|---|---|
| 2012/0102974 A1* | 5/2012 | Kawazoe | ........... | B60H 1/00035 |
| | | | | 62/3.61 |
| 2012/0117983 A1* | 5/2012 | Akiyama | ........... | B60H 1/00478 |
| | | | | 62/3.4 |
| 2012/0210731 A1* | 8/2012 | Campbell | ............... | F25B 21/02 |
| | | | | 62/3.2 |
| 2013/0192272 A1* | 8/2013 | Ranalli | ................... | F25B 21/04 |
| | | | | 62/3.3 |
| 2014/0190658 A1* | 7/2014 | Park | ....................... | B60H 3/024 |
| | | | | 165/8 |
| 2014/0352328 A1* | 12/2014 | Quisenberry | ...... | B60H 1/00478 |
| | | | | 62/3.3 |

FOREIGN PATENT DOCUMENTS

| | | | | |
|---|---|---|---|---|
| JP | 2006232164 | * | 9/2006 | ............. B60H 1/32 |
| JP | 2014-037774 A | | 2/2014 | |
| KR | 10-2009-0106209 A | | 10/2009 | |
| KR | 10-2010-0128516 A | | 12/2010 | |
| KR | 10-2012-0035010 A | | 4/2012 | |
| KR | 10-2014-0044672 A | | 4/2014 | |

\* cited by examiner

DEHUMIDIFIER FOR VEHICLE

CROSS-REFERENCE(S) TO RELATED APPLICATIONS

The present application claims priority to Korean Patent Application No. 10-2014-0159920, filed Nov. 17, 2014, the entire contents of which is incorporated herein for all purposes by this reference.

TECHNICAL FIELD

Exemplary embodiments of the present disclosure relate to a dehumidifier for a vehicle; and, particularly, to a dehumidifier for a vehicle which can dehumidify the inside of a vehicle while implementing a low power and a high fuel efficiency.

BACKGROUND

Due to a difference in temperature and humidity between indoor environments and outdoor environments of a vehicle, fog may occur on the interior surfaces of the windows of the vehicle. The fog formed on the windows screens the visual field of the driver to make it difficult to recognize a preceding vehicle or an oncoming vehicle, and in severe cases, may cause a minor collision with another vehicle or an object due to insecurity of a visual field.

In order to prevent such a risk, generally, when fog is formed on the interior surface of a window of a vehicle, a driver operates an air conditioner for defogging so as to perform a defogging for dry air discharged through an outlet to remove humidity formed on the window.

Such a general defogging system for a vehicle does not include a separate device for defogging, but utilizes a conventional air conditioner system without any change. As shown in a conventional air conditional system for a vehicle, disclosed in a Korean conventional art, a normal air conditioner system is configured to compress refrigerant through a compressor, to radiate the compressed refrigerant through a condenser, to expand the condensed refrigerant, and to flow the expanded refrigerant to an evaporator, thereby cooling air passing through the evaporator. The air, which has passed through the evaporator, is cooled to lower the relative humidity thereof, and thus is discharged as low-temperature dry air. The dry air is introduced into the room, and absorbs humidity in the room, thereby performing a defogging for the room of the vehicle.

However, since even such a conventional technique requires a compressor to be driven for generating dry air, and the compressor is driven by the power of an engine, the fuel efficiency of the vehicle is deteriorated as dehumidification is performed. In addition, since there is a large difference between an indoor temperature and the temperature of air discharged from the evaporator, a rapid change is caused in the indoor temperature, which causes dissatisfactions of customers.

The information disclosed in this Background section is only for enhancement of understanding of the general background of the inventive concept and should not be taken as an acknowledgement or any form of suggestion that this information forms the prior art already known to a person skilled in the art.

SUMMARY

An embodiment of the present inventive concept is directed to a dehumidifier for a vehicle which enables an effective defogging, without using the conventional air conditioner system.

Other objects and advantages of the present disclosure can be understood by the following description, and become apparent with reference to the embodiments of the present disclosure. Also, it is obvious to those skilled in the art to which the present inventive concept pertains that the objects and advantages of the present inventive concept can be realized by the means as claimed and combinations thereof.

In accordance with an embodiment of the present inventive concept, a dehumidifier for a vehicle includes: a heat exchanger provided in a flow path of air and configured to have a heat transfer material flowing therein so as to cool or heat the air; a first thermoelectric element provided at an air inlet side of the heat exchanger and configured to cool introduced air, the first thermoelectric element having a heat-generating surface; and a first thermal conductor configured to connect the heat-generating surface of the first thermoelectric element to the heat exchanger and radiate heat generated from the first thermoelectric element through the heat exchanger.

The heat exchanger may be an evaporator configured to cool air passing there through.

A junction surface between the first thermal conductor and the heat exchanger may be positioned at the level of or higher than an upper portion of a junction surface between the first thermal conductor and the first thermoelectric element.

The dehumidifier may further include a cooler connected to a cooling surface of the first thermoelectric element and configured to have a plurality of cooling fins, wherein air passes through the cooler before being introduced to the heat exchanger.

The amount of air passing through the heat exchanger may be more than the amount of air passing though the cooler.

A first end portion of the first thermal conductor may be configured to be joined with the heat-generating surface of the first thermoelectric element, and a second end portion of the thermal conductor may be configured to be joined with a first end portion of the heat exchanger.

In certain embodiments, the dehumidifier may further include a second thermoelectric element and a second thermal conductor. A first end portion of the second thermal conductor may be connected to a heat-generating surface of the second thermoelectric element, and a second end portion of the second thermal conductor may be connected to the first end portion of the heat exchanger. In certain embodiments, the first and second thermal conductors may be symmetrically connected to the first end portion of the heat exchanger.

In certain embodiments, the heat exchanger has one set of upper and lower opposing surfaces, and another set of opposing first and second lateral surfaces. In certain embodiments, the first end portion of the heat exchanger may be an upper surface, and the second end portion of the first thermal conductor may be configured to be joined lengthwise with the upper surface of the heat exchanger in a length direction, the length direction being a direction from the first lateral surface to the second lateral surface.

In certain embodiments, the first end portion of the heat exchanger may be the first lateral surface. The second end portion of the first thermal conductor may be configured to be joined with the first lateral surface of the heat exchanger in an upward direction, the upward direction being a direction from the lower surface to the upper surface.

In certain embodiments, a first end portion of the second thermal conductor may be connected to a heat-generating surface of the second thermoelectric element, and a second end portion of the second thermal conductor may be joined with the second lateral surface of the heat exchanger.

In certain embodiments, the first end portion of the heat exchanger may be the upper surface of the heat exchanger, a first end portion of the second thermal conductor may be joined with a heat-generating surface of the second thermoelectric element, and a second end portion of the second thermal conductor may be joined with the first lateral surface of the heat exchanger.

The dehumidifier may further include a housing, with the heat exchanger and an air movement pathway inside the housing. The housing may have, at a lower end portion thereof, an outlet configured to discharge condensed water, which is generated from the cooler and drops, through a lower end portion of the housing, to the outside.

The thermal conductor may be a heat pipe.

The dehumidifier may further include a controller configured to operate the first thermoelectric element, wherein the controller may be configured to stop the operation of the first thermoelectric element when a compressor operates to perform a cooling function of the evaporator.

The dehumidifier may further include a controller configured to operate the first thermoelectric element and a humidity sensor configured to detect the humidity of a room in the vehicle, wherein the controller may operate the first thermoelectric element when a detected humidity of the room of the vehicle is greater than or equal to a reference operation humidity value.

The dehumidifier may further include a controller configured to operate the first thermoelectric element and a humidity sensor configured to detect the humidity of a room in the vehicle, wherein the controller may control a voltage value or a current value applied to the first thermoelectric element in proportion to a detected humidity of the room in the vehicle.

The dehumidifier may further include a blower configured to blow air to the heat exchanger; and a controller configured to operate the blower and the first thermoelectric element, wherein the controller may be configured to operate the blower to supply a set minimum amount of air when the first thermoelectric element operates.

According to the dehumidifier for a vehicle having a structure as described above, it is possible to implement low power and simultaneously to achieve an effective dehumidification effect through the effective arrangement structure of the thermoelectric element, and thus it is possible to perform the dehumidification function without a significant deterioration in the fuel efficiency of the vehicle.

In addition, since the evaporator of the existing air conditioner system may be used as a heat-radiating body of the thermoelectric element, an additional cost for providing a heat-radiating body is not required, a sufficient area for heat radiation can be ensured, and a layout can be simplified.

DETAILED DESCRIPTION

Figure 1:
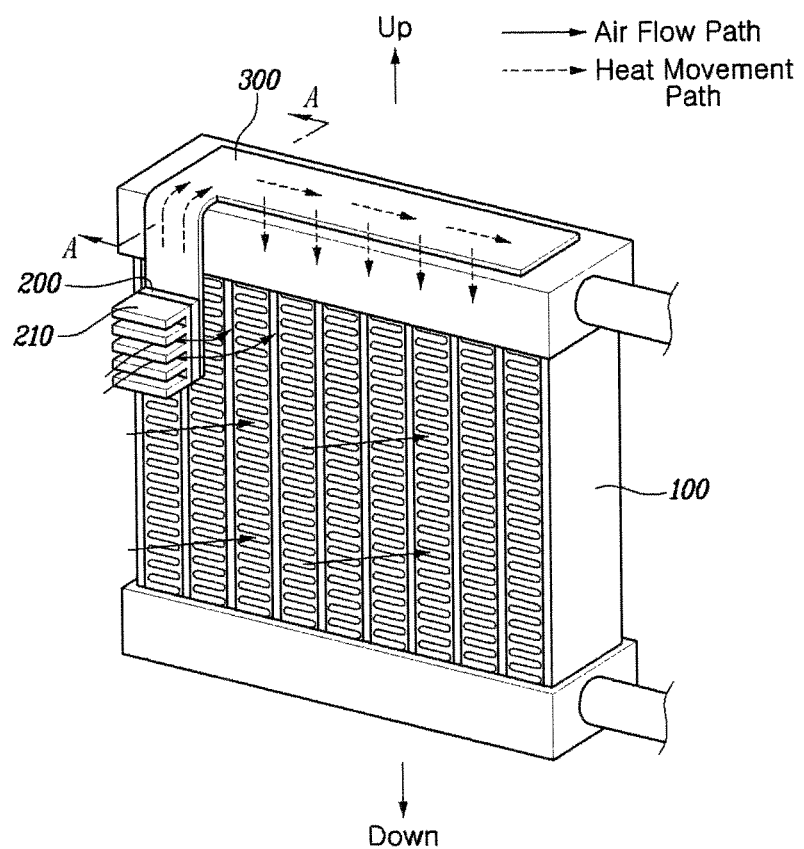
FIG. 1 is a view illustrating a configuration of a dehumidifier for a vehicle in accordance with a first embodiment of the present inventive concept.

A dehumidifier for a vehicle in accordance with exemplary embodiments of the present inventive concept will be described below in more detail with reference to the accompanying drawings. The present inventive concept may, however, be embodied in different forms and should not be construed as limited to the embodiments set forth herein. Rather, these embodiments are provided so that this disclosure will be thorough and complete, and will fully convey the scope of the present inventive concept to those skilled in the art. Throughout the disclosure, like reference numerals refer to like parts throughout the various figures and embodiments of the present inventive concept.

FIG. 1 is a view illustrating the configuration of a dehumidifier for a vehicle in accordance with a first embodiment of the present inventive concept. In accordance with the first embodiment of the present inventive concept, the dehumidifier for a vehicle includes: a heat exchanger 100 provided in a flow path of air and configured to have a heat transfer material flowing therein so as to cool or heat the air; a first thermoelectric element 200 provided at an air inlet side of the heat exchanger 100 and configured to cool introduced air; and a first thermal conductor 300 configured to connect the heat-generating surface of the first thermoelectric element 200 to the heat exchanger 100 so that heat generated from the first thermoelectric element 200 can be radiated through the heat exchanger 100.

Specifically, it is preferred that the heat exchanger 100 is configured with an evaporator for cooling air which is introduced therein and passes therethrough. The evaporator is a device, to which refrigerant compressed through a compressor, condensed via an evaporator, and then expanded by an expansion value is introduced: wherein, when air introduced by a blower passes through the evaporator, heat of the air is absorbed to be changed to low-temperature dry air, thereby lowering the temperature of the indoor air of a vehicle and removing indoor moisture.

In contrast, according to the embodiment of the present inventive concept, the evaporator is connected to the heat-generating surface of the first thermoelectric element 200 so as to function as a heat-radiating body of the first thermoelectric element 200, and heats air passing through the evaporator to increase the relative humidity of the air so that air to be finally introduced into the room of the car can be discharged as dry air.

In certain embodiments, instead of the evaporator, a heater core may be used as the heat exchanger 100 according to the intention of a designer. In certain embodiments, a separate heat-radiating device having radiation fins may be additionally provided and used.

Figure 2:
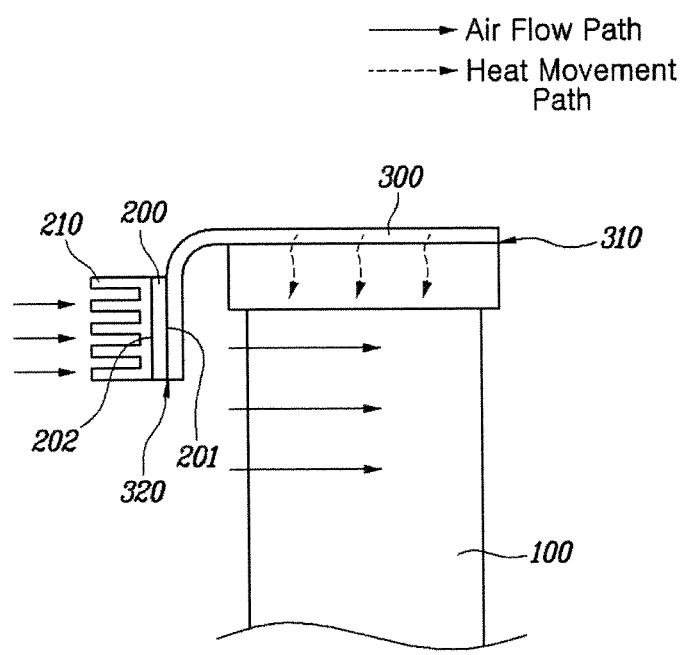
FIG. 2 is a cross-sectional view taken along line A-A in FIG. 1.

Meanwhile, as shown in FIG. 2, the first thermoelectric element 200 may be configured with a Peltier module, wherein the first thermoelectric element 200 includes a heat-generating surface 201 and a cooling surface 202. When current is applied to the inside of the first thermoelectric element 200, the heat-generating surface 201 generates heat, while the cooling surface 202 is cooled, wherein the difference of temperature between the heat-generating surface 201 and the cooling surface 202 can increase proportionally as a voltage or current applied thereto increases.

As the radiation efficiency of heat generated from the heat-generating surface 201 increases, the cooling effect in the cooling surface 202 increases, so that the operating efficiency of the first thermoelectric element 200 can increase. Thus, for smooth heat transfer, it is preferred that the junction surface 310 between the first thermal conductor 300 and the heat exchanger 100 is positioned at the level of or higher than an upper portion of the junction surface 320 between the first thermal conductor 300 and the first thermoelectric element 200.

In this case, it is preferred that the first thermal conductor 300 is configured with a heat pipe. The heat pipe has a structure characteristic which transfers heat from one end to the other end while fluid is moving by heat convection therein. Therefore, in order that the one end joined with the heat-generating surface 201 of the first thermoelectric element 200 is heated to smoothly move internal fluid to the other end joined with the heat exchanger 100, the other end must be positioned at the level of or lower than the one end. It goes without saying that the first thermal conductor 300 may be configured with a heat-conductible material, e.g. a metal panel, in addition to the heat pipe, or may be configured with heat conduction means of various shapes.

Meanwhile, a position at which the other end of the first thermal conductor 300 is joined with the heat exchanger 100 may be determined in various ways, which may be implemented in various embodiments as shown in FIGS. 1 and 3 to 6.

In detail with respect to the respective embodiments, as shown in FIGS. 1 and 3 to 6, one end portion of the first thermal conductor 300 may be joined with the heat-generating surface of the first thermoelectric element 200, and the other end portion of the first thermal conductor 300 may be connected to be joined with one end portion of the heat exchanger 100.

In certain embodiments, as shown in FIG. 1, the other end portion of the first thermal conductor 300 may be connected to be joined lengthwise with the upper end portion of the heat exchanger 100 along the lateral length of the upper end portion, and in certain embodiments, the other end portion of the first thermal conductor 300 may be connected to be joined lengthwise with the upper surface of the heat exchanger 100 along the length of the upper surface. Therefore, such a construction enables heat to be transferred in the same direction as cooling water flows, and enables heat to be equally transferred to a plurality of heat-radiating fins formed on the heat exchanger 100, thereby achieving an excellent heat-radiating effect.

In addition, since the first thermal conductor 300 is connected to the upper end portion of the heat exchanger 100, the position of the first thermoelectric element 200 can be variously set, so that the cooling performance of the first thermoelectric element 200 can increase.

In this case, the first thermoelectric element 200 is provided additionally with a cooler 210 which is connected with the cooling surface of the first thermoelectric element 200 and has a plurality of cooling fins, wherein it is preferred that the first thermoelectric element 200 and the cooler 210 are positioned such that the entire or a part of air to be introduced to the heat exchanger 100 can pass through the cooler 210 before being introduced to the heat exchanger 100.

It is preferred that the cooler 210 is directly joined with the cooling surface of the first thermoelectric element 200 so as to be integrated with the thermoelectric element 200. However, according to the intention of a designer, a heat conductor may be provided with the first thermoelectric element 200 and the cooler 210, so that the first thermoelectric element 200 and the cooler 210 may be disposed at the same position or at mutually different positions.

In addition, it is preferred that the cooler 210 is positioned on the movement path of air introduced to the heat exchanger 100, wherein it is preferred that the position is determined such that the introduced air can be condensed and dehumidified while passing through the cooler 210, be heated to lower the relative humidity thereof while passing through the heat exchanger 100, and thus be discharged as dry air into the room of the vehicle.

Especially, it is preferred that the sizes of the cooler 210 and the heat exchanger 100 are set so that the amount of air passing through the heat exchanger 100 can be more than the amount of air passing through the cooler 210. More preferably, the sizes of the cooler 210 and the heat exchanger 100 are set so that the total heat-radiating area of the heat exchanger 100 can be at least two times larger than the total heat-radiating area of the cooler 210. Such a difference in area increases the heat-radiation efficiency of the heat-generating surface of the first thermoelectric element 200 to increase a cooling efficiency, thereby enabling condensed water to be formed on the surface of the cooler 210. The difference in area may be variously set according to the intention of a designer, in addition to two or more times.

Figure 3:
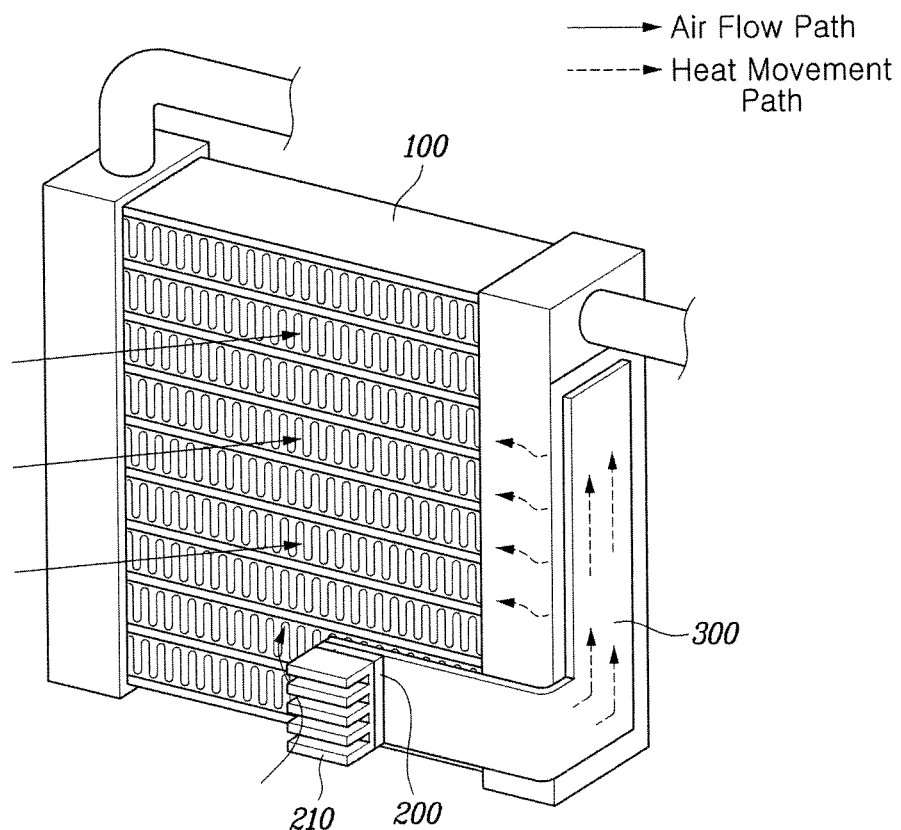
FIG. 3 is a view illustrating a configuration of a dehumidifier for a vehicle in accordance with a second embodiment of the present inventive concept.

Meanwhile, FIG. 3 is a view illustrating the configuration of a dehumidifier for a vehicle in accordance with a second embodiment of the present inventive concept. In accordance with the second embodiment of the present inventive concept, the other end portion of the first thermal conductor 300 may be connected to be joined with the lateral end portion of the heat exchanger 100 upward along the length of the heat exchanger 100. The configuration according to the second embodiment is similar to the configuration according to the first embodiment, and is different to the first embodiment only in the position of the junction thermal conductor 300 with the heat exchanger 100. As shown in FIG. 3, the heated first thermal conductor 300 causes heat to move from one-lateral end portion to the other-lateral end portion, which corresponds to the feature, in the first embodiment, wherein a heat transfer path is formed from an upper end to a lower end.

In this case, the heat exchanger 100 may be disposed to form a refrigerant movement direction from an upper end to a lower end, but preferably, may be disposed to form a refrigerant movement direction from one-lateral end portion to the other-lateral end portion so as to be similar to the heat transfer path in the first embodiment of the present inventive concept. Such configurations may be equally applied even to the first embodiment of the present inventive concept.

Figure 4:
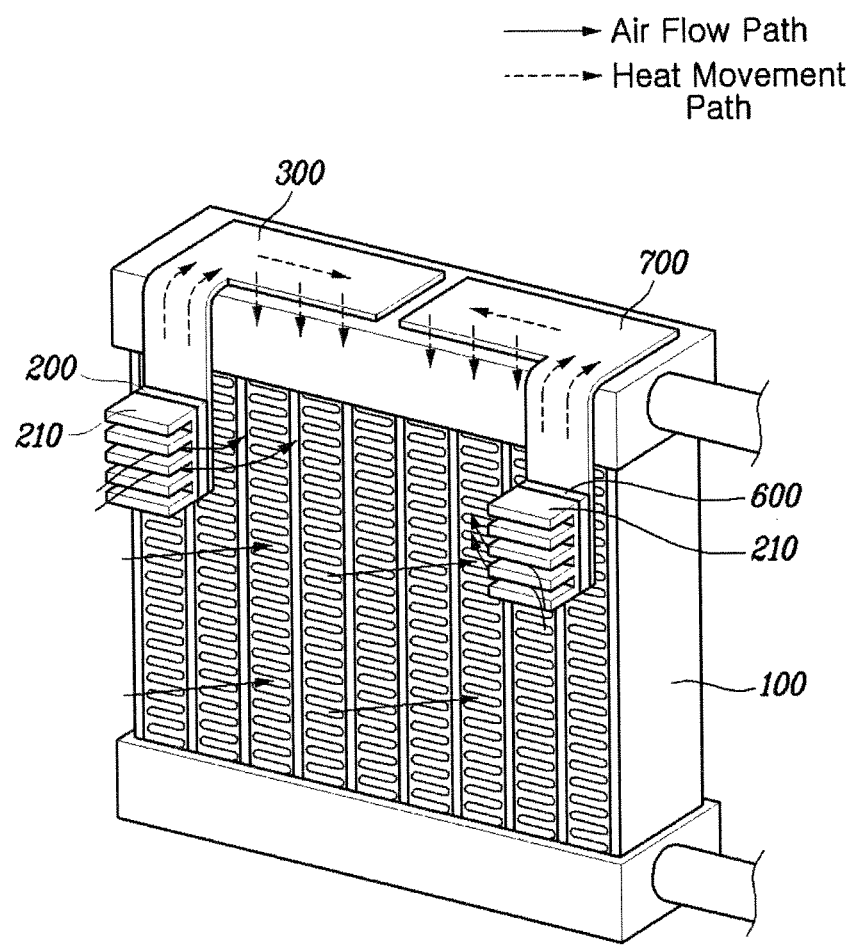
FIG. 4 is a view illustrating a configuration of a dehumidifier for a vehicle in accordance with a third embodiment of the present inventive concept.

Meanwhile, FIG. 4 is a view illustrating the configuration of a dehumidifier for a vehicle in accordance with a third embodiment of the present inventive concept. In accordance with the third embodiment of the present inventive concept, a pair of thermoelectric elements 200 and 600 and a pair of thermal conductors 300 and 700 are provided, and the other end portions of the respective thermal conductors 300 and 700 may be symmetrically connected to one end portion of the heat exchanger 100. The third embodiment may be configured to be only different from the first and second embodiments in the number of the thermoelectric elements, the number of thermal conductors, and the disposition form thereof, and to be similar to the first and second embodiments in the other configuration.

The pair of thermoelectric elements 200 and 600 and the pair of thermal conductors 300 and 700 may be connected with the heat exchanger 100 with various shapes at various positions, and preferably, may have the same forms and disposition structures as those in the first and second embodiments of the present inventive concept. More preferably, the pair of thermoelectric elements 200 and 600 also may be disposed to be symmetrical to each other, and specifically, may be disposed such that the other end portions of the thermal conductors 300 and 700 are opposite each other. Such a configuration enables uniform heat transfer and distribution to the heat exchanger 100, thereby increasing the heat-radiation efficiency. It goes without saying that the shapes and connection positions of the pair of thermal conductors 300 and 700 are not limited thereto, and may be variously set according to the intention of a designer.

Figure 5:
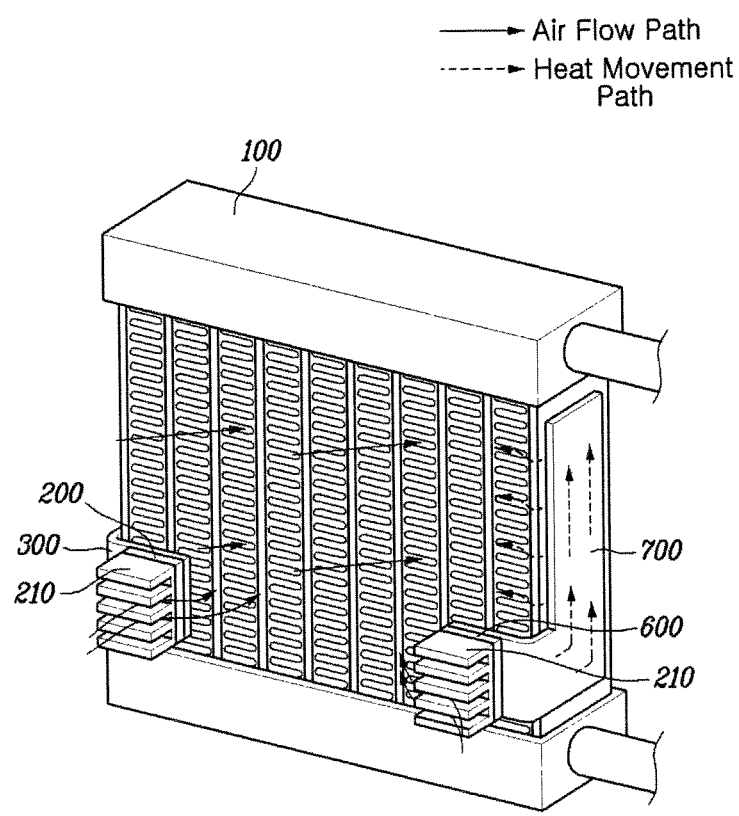
FIG. 5 is a view illustrating the configuration of a dehumidifier for a vehicle in accordance with a fourth embodiment of the present inventive concept.

Meanwhile, FIG. 5 is a view illustrating the configuration of a dehumidifier for a vehicle in accordance with a fourth embodiment of the present inventive concept. In accordance with the fourth embodiment of the present inventive concept, a pair of thermoelectric elements 200 and 600 and a pair of thermal conductors 300 and 700 are provided, and the other end portions of the thermal conductors 300 and 700 may be connected to be joined with both lateral end portions, respectively, of the heat exchanger 100. In this case, the respective connection forms between the thermoelectric elements 200 and 600 and the thermal conductors 300 and 700, and the connection structure of the heat exchanger 100 may be respectively achieved in manners similar to those in the second embodiment of the present inventive concept, but the present inventive concept is not absolutely limited thereto, the connection structure may be achieved in various manner.

Particularly, according to the structure as in the fourth embodiment, since heat is supplied from both laterals of the heat exchanger 100 and heat radiation is performed, the entire heat exchanger 100 can be effectively used, and a variation in heat radiation according to heat movement can be reduced. Accordingly, the heat-radiation efficiency can increase, which means that more heat can be supplied to air which passes through the heat exchanger 100 after passing through the cooler 210, so that the relative humidity of the air increases to improve the dehumidification effect.

Figure 6:
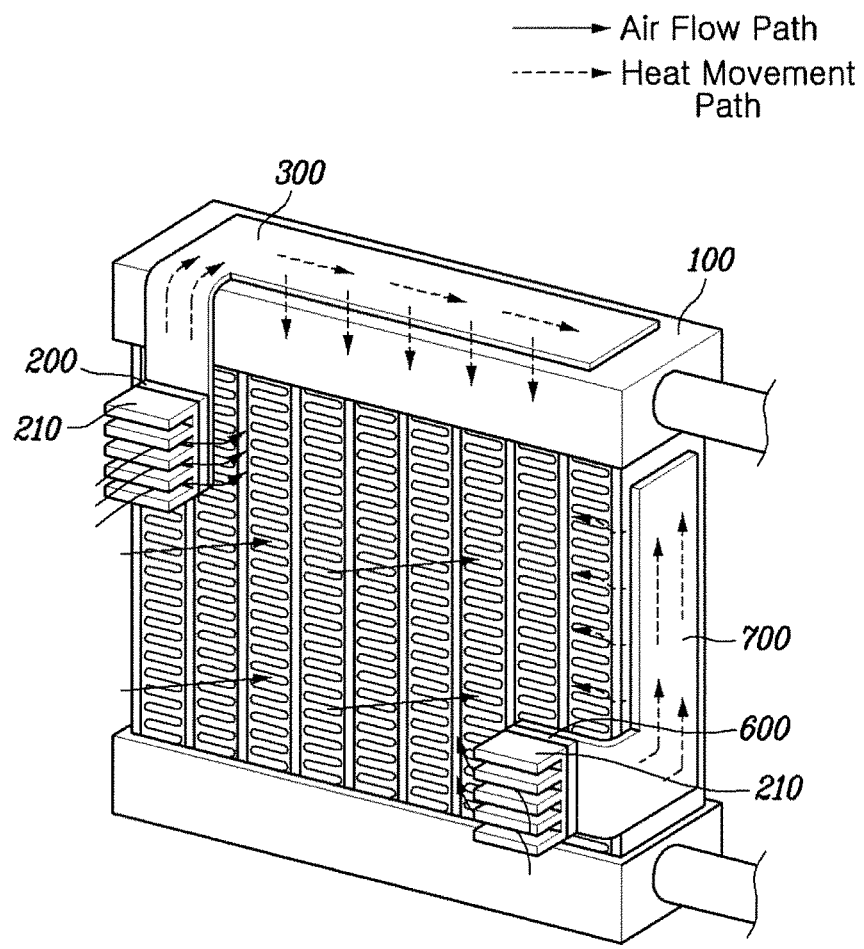
FIG. 6 is a view illustrating the configuration of a dehumidifier for a vehicle in accordance with a fifth embodiment of the present inventive concept.

Meanwhile, FIG. 6 is a view illustrating the configuration of a dehumidifier for a vehicle in accordance with a fifth embodiment of the present inventive concept. In accordance with the fifth embodiment of the present inventive concept, a pair of thermoelectric elements 200 and 600 and a pair of thermal conductors 300 and 700 are provided, and the other end portions of the thermal conductors 300 and 700 may be connected to an upper end portion and a lateral end portion, respectively, of the heat exchanger 100.

Such a configuration is a combination form of the first and third embodiment of the present inventive concept, wherein heat can be transferred from an upper end to a lower end, and simultaneously, from one-lateral end portion to the other-lateral end portion, so that uniform heat radiation can be achieved.

Figure 7:
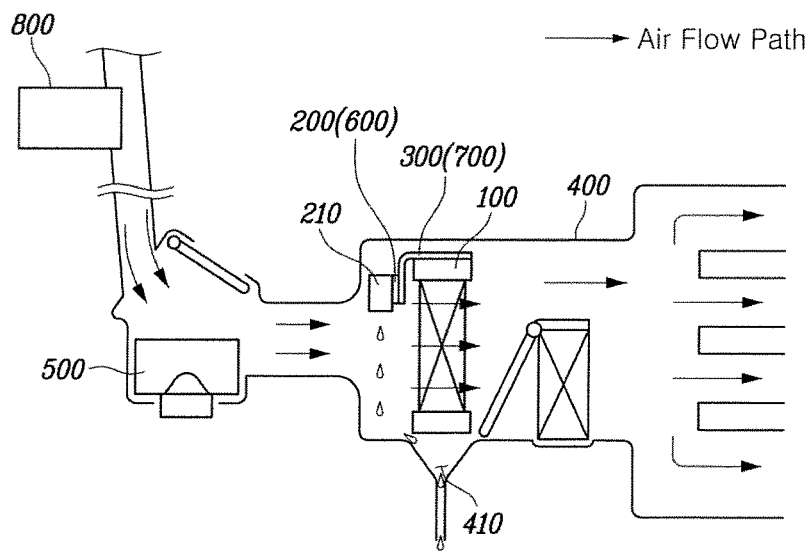
FIG. 7 is a view illustrating a condensed-water discharge path of the dehumidifier for a vehicle in accordance with the first to fifth embodiments of the present inventive concept.

Meanwhile, FIG. 7 is a view illustrating a condensed-water discharge path of the dehumidifier for a vehicle in accordance with the first to fifth embodiments of the present inventive concept. A housing 400 may have in the inside thereof with the heat exchanger 100 and an air movement pathway may be additionally included, wherein the housing 400 additionally provided at a lower end portion thereof with an outlet 410 configured to discharge condensed water, which is generated from the cooler 210 and drops to the lower end portion of the housing 400, to the outside.

The outlet 410 may be open to the outside so as to discharge the condensed water, or may be configured to transfer, through a separate pipeline, the condensed water to a chamber which stores condensed water. In addition, a funnel-shaped slope may be formed on the circumferential portion of the outlet 410 so as to lead condensed water to the outlet 410.

In addition, the dehumidifier for a vehicle in accordance with the first to fifth embodiments of the present inventive concept may additionally include a controller (not shown) for operating the first thermoelectric element 200, as shown in FIGS. 1 to 6, wherein the controller may stop the operation of the first thermoelectric element 200 when a compressor 800 operates to perform the cooling function of the heat exchanger 100.

The compressor 800 operates to perform the air conditioning function using the cooling function of the heat exchanger 100. In this case, since a mass dehumidification function is performed, it is unnecessary to drive the first thermoelectric element 200 so as to perform additional dehumidification, so that it is preferred that the operation of the first thermoelectric element 200 stops to prevent unnecessary energy consumption and to increase the fuel efficiency.

In addition, a humidity sensor (not shown) for detecting the humidity of the room of the vehicle may be additionally included. In this case, it is preferred that the controller is configured to receive a sensed humidity value and to operate the first thermoelectric element 200 when a detected humidity of the room of the vehicle is greater than or equal to a preset operation humidity value. By the configuration, the unnecessary continuous driving of the first thermoelectric element 200 can be prevented to eliminate unnecessary energy waste. The operation humidity value may be set to a value at which it is considered that dehumidification is required, which may be variously set according to the intention of a designer.

In addition, the controller may control the value of a voltage or current applied to the first thermoelectric element 200 in in proportion to the detected humidity of the room of the vehicle. As a detected indoor humidity increases, the dehumidification function of the first thermoelectric element 200 should be more activated. Therefore, in this case, the dehumidification function can be improved by increasing the applied voltage value or current value, and preferably, the applied voltage value, in proportion to the detected indoor humidity. It goes without saying that, when the indoor humidity is lowered, the applied voltage value or current value may also be lowered according to the lowered indoor humidity. By variably operating the first thermoelectric element 200 depending on an indoor humidity, as described above, dehumidification can be achieved in various environments, and unnecessary energy waste can be prevented.

When a large amount of heat is generated from the first thermoelectric element 200 due to a high humidity in the room of the vehicle, high-temperature air is discharged to the room, so that the room of the vehicle becomes hot and humid to give a driver an unpleasant feeling. Therefore, in this case, the controller may control the operation of a temperature control flap, which is provided inside the housing 400 and is configured to control a mixing degree of cooling air and warm air, thereby performing a temperature control, such as lowering the temperature of air.

Meanwhile, as shown in FIG. 7, it is preferred that a blower 500 for blowing air to the heat exchanger 100 is additionally included, and that the controller controls the blower 500 to be driven to supply a preset minimum amount of air when the first thermoelectric element 200 operates.

The first thermoelectric element 200 can operate at any time when meeting the operating condition thereof. Therefore, by setting the power of the blower 500 to a minimum amount of air, while dehumidification is being performed, the amount of air discharged by the blower 500 can be prevented from giving the passengers of the vehicle an unpleasant feeling, differently from the intention of the driver. It goes without saying that the amount of air may be variously set according to environments and the intention of a designer.

According to the dehumidifier for a vehicle having a structure as described above, it is possible to implement low power and simultaneously to achieve an effective dehumidification effect through the effective arrangement structure of the thermoelectric element, and thus it is possible to perform the dehumidification function without a significant deterioration in the fuel efficiency of the vehicle.

In addition, since the evaporator of the existing air conditioner system is used as a heat-radiating body of the thermoelectric element, an additional cost for providing a heat-radiating body is not required, a sufficient area for heat radiation can be ensured, and a layout can be simplified.

While the present inventive concept has been described with respect to the specific embodiments, it will be apparent to those skilled in the art that various changes and modifications may be made without departing from the spirit and scope of the inventive concept as defined in the following claims.

What is claimed is:

1. A dehumidifier for a vehicle, comprising:
a heat exchanger provided in a flow path of air and configured to have a heat transfer material flowing therein so as to cool or heat the air;
a first thermoelectric element provided at an air inlet side of the heat exchanger and configured to cool introduced air, the first thermoelectric element having a heat-generating surface; and
a first thermal conductor configured to connect the heat-generating surface of the first thermoelectric element to the heat exchanger and radiate heat generated from the first thermoelectric element through the heat exchanger,
wherein a first end portion of the first thermal conductor is configured to be joined with the heat-generating surface of the first thermoelectric element, and a second end portion of the first thermal conductor is configured to be joined with a first end portion of the heat exchanger,
wherein the heat exchanger has one set of upper and lower opposing surfaces, and another set of opposing first and second lateral surfaces,
wherein the first end portion of the heat exchanger is an upper surface, and the second end portion of the first thermal conductor is configured to be joined lengthwise with the upper surface of the heat exchanger in a length direction, the length direction being a direction from the first lateral surface to the second lateral surface,
wherein the first thermal conductor is a heat pipe,
wherein a junction surface between the first thermal conductor and the heat exchanger is positioned higher than an upper portion of a junction surface between the first thermal conductor and the first thermoelectric element,
wherein the first thermal conductor includes a first bending portion and a second bending portion,
wherein the first thermal conductor extends upward from the first end portion joined with the first thermoelectric element and is curved at the first bending portion to be joined with a first end of the upper surface of the heat exchanger, and
wherein the first thermal conductor is further curved at the second bending portion to extend along the length direction from the first lateral surface to the second lateral surface of the heat exchanger by being joined lengthwise with the upper surface of the heat exchanger.

2. The dehumidifier of claim 1, wherein the heat exchanger is an evaporator configured to cool air passing therethrough.

3. The dehumidifier of claim 1, further comprising a cooler connected to a cooling surface of the first thermoelectric element and configured to have a plurality of cooling fins,
wherein air passes through the cooler before being introduced to the heat exchanger.

4. The dehumidifier of claim 3, wherein the amount of air passing through the heat exchanger is more than the amount of air passing though the cooler.

5. The dehumidifier of claim 1, further comprising:
a second thermoelectric element; and
a second thermal conductor,
wherein a first end portion of the second thermal conductor is connected to a heat-generating surface of the second thermoelectric element, and a second end portion of the second thermal conductor is connected to the first end portion of the heat exchanger.

6. The dehumidifier of claim 5, wherein the first and second thermal conductors are symmetrically connected to the first end portion of the heat exchanger.

7. The dehumidifier of claim 1, wherein the first end portion of the heat exchanger is the first lateral surface, and the second end portion of the first thermal conductor is configured to be joined with the first lateral surface of the heat exchanger in an upward direction, the upward direction being a direction from the lower surface to the upper surface.

8. The dehumidifier of claim 7, further comprising:
a second thermoelectric element; and
a second thermal conductor, wherein a first end portion of the second thermal conductor is connected to a heat-generating surface of the second thermoelectric element, and a second end portion of the second thermal conductor is joined with the second lateral surface of the heat exchanger.

9. The dehumidifier of claim 1, further comprising:
a second thermoelectric element; and a second thermal conductor,
wherein the first end portion of the heat exchanger is the upper surface of the heat exchanger,
a first end portion of the second thermal conductor is joined with a heat-generating surface of the second thermoelectric element, and a second end portion of the second thermal conductor is joined with the first lateral surface of the heat exchanger.

10. The dehumidifier of claim 3, further comprising a housing, wherein the heat exchanger and an air movement pathway are inside the housing, and wherein the housing has, at a lower end portion thereof, an outlet configured to discharge condensed water, which is generated from the cooler and drops, through a lower end portion of the housing, to the outside.

11. The dehumidifier of claim 2, further comprising a controller configured to operate the first thermoelectric element,
wherein the controller is configured to stop the operation of the first thermoelectric element when a compressor operates to perform a cooling function of the evaporator.

12. The dehumidifier of claim 1, further comprising:
a controller configured to operate the first thermoelectric element; and
a humidity sensor configured to detect the humidity of a room in the vehicle,
wherein the controller operates the first thermoelectric element when a detected humidity of the room of the vehicle is greater than or equal to a reference operation humidity value.

13. The dehumidifier of claim 1, further comprising:
a controller configured to operate the first thermoelectric element; and
a humidity sensor configured to detect the humidity of a room in the vehicle,
wherein the controller controls a voltage value or a current value applied to the first thermoelectric element in proportion to a detected humidity of the room in the vehicle.

14. The dehumidifier of claim 1, further comprising:
a blower configured to blow air to the heat exchanger; and
a controller configured to operate the blower and the first thermoelectric element,
wherein the controller is configured to operate the blower to supply a set minimum amount of air when the first thermoelectric element operates.

* * * * *